United States Patent [19]

Ando et al.

[11] Patent Number: 4,514,646
[45] Date of Patent: Apr. 30, 1985

[54] SEMICONDUCTOR INTEGRATED CIRCUIT DEVICE INCLUDING A PROTECTIVE RESISTOR ARRANGEMENT FOR OUTPUT TRANSISTORS

[75] Inventors: Yoshibumi Ando, Kodaira; Takashi Sakamoto, Tachikawa; Kanji Yoh, Mitaka; Hisahiro Moriuchi, Koganei; Sumiaki Takei, Fuchu, all of Japan

[73] Assignees: Hitachi, Ltd.; Hitachi Microcomputer Engineering Ltd., both of Tokyo, Japan

[21] Appl. No.: 290,653

[22] Filed: Aug. 6, 1981

[30] Foreign Application Priority Data

Aug. 20, 1980 [JP] Japan ................................ 55-113518

[51] Int. Cl.³ ......................... H03K 17/08; H02H 3/20
[52] U.S. Cl. ................................ 307/200 B; 307/585; 357/23.13; 361/91
[58] Field of Search ............... 361/56, 91; 357/23 GP, 357/41; 307/572, 577, 579, 270, 443, 279, 308, 200 B, 304, 576

[56] References Cited

U.S. PATENT DOCUMENTS

| | | | |
|---|---|---|---|
| 3,754,171 | 8/1973 | Anzai et al. | 357/23 GP X |
| 4,011,467 | 3/1977 | Shimada et al. | 307/304 X |
| 4,027,173 | 5/1977 | Nomiya et al. | 307/304 X |
| 4,062,039 | 12/1977 | Nishimura | 357/23 GP X |
| 4,066,918 | 1/1978 | Heuner et al. | 307/304 |
| 4,160,923 | 7/1979 | Maeda et al. | 307/308 |
| 4,209,713 | 6/1980 | Satou et al. | 307/443 X |
| 4,261,004 | 4/1981 | Masuhara et al. | 357/23 GP X |
| 4,288,829 | 9/1981 | Tango | 357/23 GP |

FOREIGN PATENT DOCUMENTS

| | | | |
|---|---|---|---|
| 53-76679 | 7/1978 | Japan | 357/23 GP |
| 4,114,186 | 6/1979 | Japan | 357/59 R |
| 55-29108 | 3/1980 | Japan | 357/59 R |
| 1558502 | 7/1976 | United Kingdom . | |

Primary Examiner—Stanley D. Miller
Assistant Examiner—David R. Bertelson
Attorney, Agent, or Firm—Antonelli, Terry & Wands

[57] ABSTRACT

An abnormal surge voltage such as frictional static electricity is often applied to the external terminals of a MOSIC. In the past, the output MOS transistor in the MOSIC during normal handling of the device frequently will have its gate insulating film broken down by the application of such an abnormal surge voltage to the drain thereof. In order to prevent the gate insulating film from being broken down, in this manner a resistor is connected between the gate of the output MOS transistor and a drive circuit for driving that output MOS transistor. This construction using a resistor is superior to the construction in which the voltage to be applied to the drain of the output MOS transistor is clamped by the use of suitable clamp means only because, with the resistor arrangement, the output characteristics of the MOSIC are not restricted.

12 Claims, 9 Drawing Figures

SEMICONDUCTOR INTEGRATED CIRCUIT DEVICE INCLUDING A PROTECTIVE RESISTOR ARRANGEMENT FOR OUTPUT TRANSISTORS

BACKGROUND OF THE INVENTION

The present invention relates to a semiconductor integrated circuit device, and more particularly to a semiconductor integrated circuit device (which will be referred to hereinafter as "MISIC") which is constructed of insulated gate type field effect transistors (which will be referred to hereinafter as "MISFETs").

An abnormally high voltage due to frictional static electricity is frequently applied to the external terminals of an MISIC during transportation or handling.

The gate insulating film of a MESFET usually has such a relatively low breakdown voltage that it is broken down when the abnormally high voltage is applied to the gate electrode thereof.

In order to prevent the breakdown, therefore, a gate protecting element or circuit is usually provided in the MISIC in a manner to correspond to its MISFET for receiving an external signal.

However, the investigations of the Inventors have revealed that the abnormally high voltage will break down the gate insulating film of not only the signal receiving MISFET but also a signal output MISFET of the MISIC. As a result, the MISIC is rendered substantially inoperative when its signal output MISFET is broken down, although the signal receiving MISFET is protected against the abnormal voltage by providing the gate protecting means at the signal receiving external terminal thereof.

SUMMARY OF THE INVENTION

It is, therefore, an object of the present invention to provide a semiconductor integrated circuit device which has its signal output MISFET protected against an abnormally high voltage.

Another object of the present invention is to provide a semiconductor integrated device which can be highly integrated and can have its reliability improved.

The other objects of the present invention will become apparent from the following description made with reference to the accompanying drawings.

In the semiconductor integrated circuit according to the present invention, the signal output MISFET, in which the drain or source electrode acting as an output electrode is connected with a signal output external terminal, has its gate electrode connected through a resistor arrangement to drive means.

Even in case an abnormally high voltage happens to be applied to the signal generating external terminal, the gate insulating film of the signal output MISFET is protected by the resistor arrangement.

Such an abnormally high voltage as has been described above will be undesirably applied to an unintended arbitrary external terminal. Therefore, in case the semiconductor integrated circuit device is equipped with a plurality of signal output external terminals, the resistor arrangement is provided for each of the signal output MISFETs which are used to feed signals to the signal output external terminals, respectively.

Those signal output MISFETs may be constructed of an output buffer circuit of various types including inverter, NOR and NAND circuit types.

As will be apparent from the later description, the breakdown of the gate insulating film due to an abnormally high voltage is liable to take place especially in a signal generating MISFET, in which a parasitic capacitance between its gate electrode and its output electrode is relatively reduced, such as a silicon gate MISFET which is fabricated by the self-alignment technique. As a result, the present invention can exhibit excellent effects when it is applied to a semiconductor integrated circuit device including the signal output MISFET which is fabricated by the self-alignment technique.

DESCRIPTION OF THE PREFERRED EMBODIMENTS

The present invention will now be described in detail in connection with the embodiments thereof.

Figure 1:
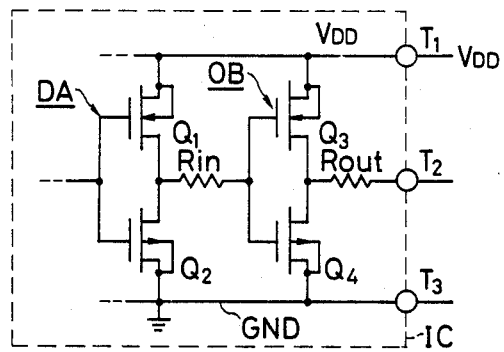
FIG. 1 is a circuit diagram showing one embodiment of the present invention.

FIG. 1 is a circuit diagram showing an output buffer circuit OB and a drive circuit DA, both of which are constructed in a semiconductor integrated circuit device according to one embodiment of the present invention.

The output buffer circuit OB is constructed of an N-channel type MISFET $Q_3$ and a P-channel type MISFET $Q_4$. The N-channel type MISFET $Q_3$ has its source and substrate gate connected with the power source receiving external terminal $T_1$ of a semiconductor integrated circuit device IC, and the P-channel MISFET $Q_4$ likewise has its source and substrate gate connected with an external terminal $T_3$, at which the reference potential of the circuit is provided.

The drains of the MISFETs $Q_3$ and $Q_4$ are connected with each other thereby to construct the output terminal of the output buffer circuit OB. This output terminal is connected, as shown through a resistor $R_{out}$ with a signal output external terminal $T_2$.

The gates of the MISFETs $Q_3$ and $Q_4$ are connected with each other thereby to construct the input terminal of the output buffer circuit OB.

The drive circuit DA is constructed of an N-channel type MISFET $Q_1$ and a P-channel type MISFET $Q_2$.

These MISFETs $Q_1$ and $Q_2$ are connected in series between the terminals $T_1$ and $T_3$ similarly to those MISFETs $Q_3$ and $Q_4$.

The output terminal of the drive circuit DA and the input terminal of the output buffer circuit OB are connected, as shown, by a resistor $R_{in}$ with each other.

As will be apparent from the later description, the resistor $R_{in}$ has its construction so considered that a high stray capacitance is not established between itself and the power source wiring or the like of the circuit. On the contrary, the resistor $R_{out}$ has its construction so considered that a relatively high stray capacitance is established between itself and the power source wiring or the like of the circuit.

Figure 7:
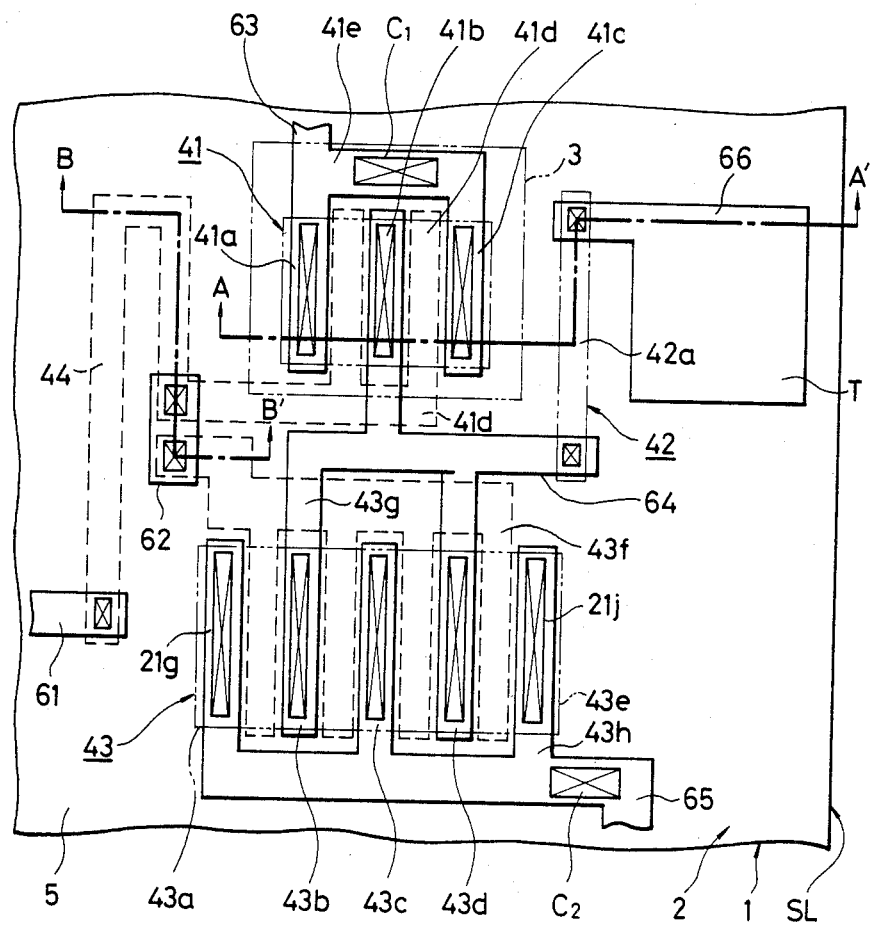
FIG. 7 is a top plan view showing the MISFETs constructing an output buffer circuit.
Figure 8:
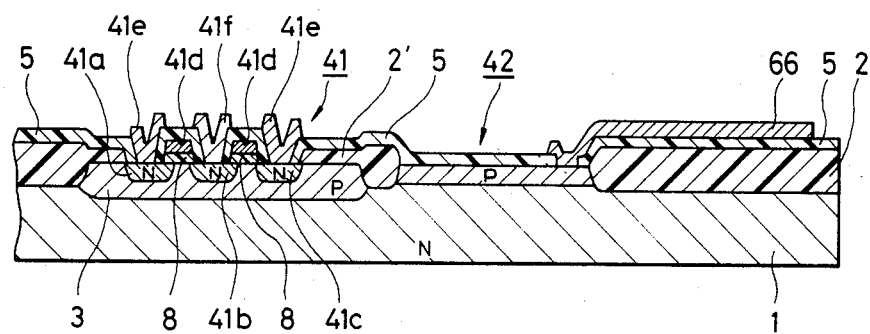
FIGS. 8 and 9 are sections taken along lines A—A' and B—B' of FIG. 7, respectively.
Figure 9:
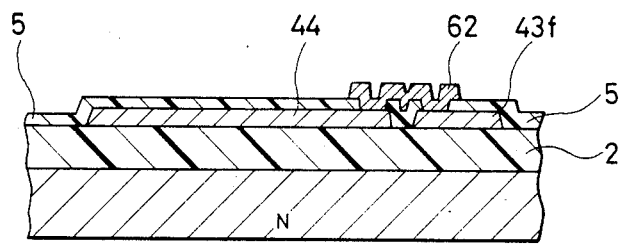

FIG. 7 is a top plan view showing the semiconductor integrated circuit device which constructs the output buffer circuit OB of FIG. 1. FIGS. 8 and 9 are sections taken along lines A—A' and B—B' of FIG. 7. In FIG. 7, incidentally, the output buffer circuit OB is arranged, as customary, at a portion in the vicinity of the side line SL of a semiconductor substrate 1.

Although not especially limitative, the semiconductor substrate 1 is constructed of N-type single-crystalline silicon which is made to have a thickness of about 200 μm and a specific resistance of 10Ω cm and which has its principal surface arranged in parallel with a surface (100).

On the principal surface of the semiconductor substrate 1, there is formed such a P-type well region 3 as is formed into a pattern indicated in two-dotted chain lines in FIG. 7 and as is made to have a depth of about 8 μm. Of the P-type well region 3, a portion 41 indicated in the two-dotted chain lines in FIG. 7 is used to act as the N-channel type MISFET forming region.

Likewise, other portions 42 and 43 indicated in two-dotted chain lines in FIG. 7 are used to act as the semiconductor resistor forming region and the P-channel type MISFET forming region, respectively.

The surfaces of the P-type well region 3 and the semiconductor substrate 1, except for the element forming regions 41, 42 and 43, are covered, as is apparent from the section shown in FIG. 8, for example, with a field insulating film 2' or 2 which is made of silicon oxide having a relatively large thickness. The field insulating film 2 is prepared by the well-known selectively heating oxidization technique, although not limited thereto, to have a thickness of about 1.2 μm.

The surface of the P-type well region 3 to form the element forming region 41 is formed, as shown in FIG. 8, with N-type semiconductor regions 41a and 41c for providing the source regions of the N-channel output MISFET and with an N-type semiconductor region 41b for providing the drain region of the same such that all those regions 41a, 41b and 41c are made to have a depth of about 1 μm.

The surface of the P-type well region 3 among the N-type semiconductor regions 41a, 41b and 41c is formed with a gate electrode 41d, which is made of N-type polycrystalline silicon having a thickness of about 3500 Å, through a gate insulating film 8 which is made of silicon oxide having a relatively small thickness of about 700 to 800 Å. The gate electrode 41d thus made is extended, as is indicated in broken lines in FIG. 7, to above the thick field insulating film 2 surrounding the element forming region 41.

The surface of the semiconductor substrate 1 is formed, as shown in FIG. 8, with an insulating film 5 which is made of silicon oxide having a relatively large thickness of about 0.9 μm. This insulating film 5 thus made is utilized as an inter-layer insulator for multilayered wiring. This insulating film 5 is formed, as indicated at symbols X in FIG. 7, with openings through which the semiconductor regions and poly-crystalline silicon layers therebelow are exposed to the outside.

With the N-type semiconductor regions 41a and 41c which are exposed through the openings formed in the insulating film 5, there is connected a source electrode 41e which is made of an evaporated aluminum layer having a thickness of about 1 μm, for example. The source electrode 41e thus formed is made, as shown in FIG. 7, to merge into a power source wiring layer 63 which is formed simultaneously with the source electrode 41e and which is extended to above the thick field insulating film 2. Incidentally, the source electrode 41e is connected at an opening portion C₁ with the P-type well region 3. As a result, this P-type well region 3 acting as the substrate gate of the N-channel MISFET is maintained at the potential of the power source wiring 63.

With the N-type semiconductor region 41b, there is likewise connected a drain electrode 41f which is made of an aluminum layer. The drain electrode 41f thus made is arranged to merge into an output wiring layer 64 which is extended to above the field insulating film 2.

The semiconductor substrate 1 which forms the element forming region 43 is formed thereon with P-type semiconductor regions 43a to 43e to be used as the source and drain regions of the P-channel type output MISFET. The surface of the semiconductor substrate 1 among the P-type semiconductor regions 43a to 43e is formed through a relatively thin gate oxide film having a thickness of about 700 to 800 Å with a gate electrode 43f which is made of P-type poly-crystalline silicon having a thickness of about 3500 Å. The pattern of the gate electrode 43f thus made is shown in broken lines in FIG. 7. The gate electrode 43f is extended to above the thick field oxide film 2.

With the P-type semiconductor regions 43b and 43d, i.e., the drain regions, there is connected a drain electrode 43g which is made of an evaporated aluminum layer. This drain electrode 43g is extended to above the field oxide film 2 through the insulating film 5 and is made to merge into the output wiring layer 64.

A source electrode 43h is connected with the P-type semiconductor regions 43a, 43c and 43e, i.e., the source regions. The source electrode 43h thus connected is extended to above the field oxide film 2 through the insulating film 5 and is made to merge into a power source wiring layer 65 which is made of an evaporated aluminum layer. The source electrode 43h is connected with the semiconductor substrate 1 through an opening portion C₂ which is formed in the insulating film 5 and the field oxide film 2 below the former. As a result, the semiconductor substrate 1 acting as the substrate gate of the P-channel MISFET is maintained at the potential of the wiring layer 65.

The gate electrode 41d made of N-type poly-crystalline silicon and the gate electrode 43f made of P-type poly-crystalline silicon are connected, as shown in FIGS. 7 and 9, with each other through a wiring layer 62.

The field oxide film 2 is formed thereon through the insulating film 5 with a wiring layer 61 which is made of an evaporated aluminum layer. That wiring layer 61 is used as the output line of the drive circuit DA (which should be referred to FIG. 1). In the embodiment shown in FIG. 7, the wiring layers 61 and 62 are not connected directly with each other although they are positioned relatively close to each other.

In accordance with the embodiment thus far described, in order to couple the wiring layers 61 and 62, a resistor layer 44 is formed on the field oxide film 2. The resistor film 44 is made to have its one terminal constructed substantially of the wiring layer 61 and its other terminal constructed substantially of the wiring layer 62.

In order not to increase the number of the IC fabricating steps, the resistor layer 44 and the gate electrode 41d are made of the identical N-type poly-crystalline silicon layer, although not limited thereto.

The resistor layer 44 is required to have a relatively high resistance, as will be apparent from the later description. For this requirement, the resistor layer 44 is made, as shown in FIG. 7, to have its effective length increased by having a folded pattern.

For example, in case the N-type poly-crystalline silicon layer is made to have a sheet resistance of about 60 ohms/□, the resistor layer 44 is made to have a width of about 4 μm and an effective length as large as about 300 μm. In this case, the resistor layer 44 acquires a resistance of about 4.5 kiloohms.

Incidentally, that resistor layer 44 need not have the folded pattern in the case where a portion of the poly-crystalline silicon layer to be used as the resistor material has a relatively low concentration of the conduction determining type impurity, or where the terminal portion of the output wiring layer 61 can be formed sufficiently apart from the wiring layer, and so on.

The parasitic capacitance to be established between the resistor layer 44 and the semiconductor substrate 1 is desired to have a small value. For this desire, the resistor layer 44 is formed, as has been described in the above, through the thick field oxide film 2 on the semiconductor substrate 1.

In FIG. 7, the output wiring layer 64 of the output buffer circuit is connected with one terminal of a semiconductor resistor region 42a which is made of a P-type silicon region forming a PN junction with the semiconductor substrate 1. The semiconductor resistor region 42a is made to have a relatively low resistance of about 200 Ω, for example. With the other terminal of the semiconductor resistor region 42a, there is connected a wiring layer which is made of an evaporated aluminum layer merging into a bonding pad 66.

The semiconductor construction thus far described can be obtained by the well-known fabricating technique.

The semiconductor regions 41a to 41c constructing the N-channel type output MISFET are formed by such a well-known self-alignment technique as uses the gate electrode 41d as a mask for introducing an impurity. More specifically, after the P-type well region 3, the field oxide film 2 and the gate oxide film 8 have been formed by the well-known method, for example, a poly-crystalline silicon layer is formed on the principal surface of the semiconductor substrate 1 by a method such as the CVD (i.e., Chemical Vapor Deposition) method. Then, the poly-crystalline silicon layer is selectively etched such that the layers 41d, 43f, 44 and so on are left as they are. A silicon oxide film is formed on the principal surface of the semiconductor substrate 1 by the CVD method. The silicon oxide film is removed from the element forming region 41 and the poly-crystalline silicon layers 41d and 44 by the selective etching method. At this time, that portion of the element forming region 41, which is not covered with the poly-crystalline silicon layer 41d, is exposed to the outside. Then, the poly-crystalline silicon layers 41d and 44 and the element forming region 41 are doped with an N-type impurity by the method such as the impurity diffusion method. As a result, the N-type semiconductor regions 41a to 41c are formed on the element forming region 41.

Since the overlap between the N-type semiconductor regions 41a to 41c and the gate electrode 41d is reduced by the self-alignment technique, no more than a relatively low parasitic capacitance is established between the N-type semiconductor regions 41a to 41c and the gate electrode 41d.

Likewise, the semiconductor regions 43a to 43e constructing the P-channel type output MISFET is aligned with the gate electrode 43f. For example, under the condition in which the poly-crystalline silicon layers 41d and 44 and the element forming region 41 are covered with the silicon oxide film, the poly-crystalline silicon layer 43f and the element forming region 43 are doped with a P-type impurity such as boron. Simultaneously with this, incidentally, the element forming region 42 is doped with a P-type impurity. Thus, no more than a similarly low parasitic capacitance is established between the semiconductor regions 43a to 43e of the P-channel type MISFET and the gate electrode 43f.

Although not especially limitative, the semiconductor substrate is attached to a tab portion (although not shown) of a lead frame, and the bonding pad and a lead portion of the lead frame are connected with each other by the well-known wire bonding technique. Then, the semiconductor substrate and the lead frame are sealed by a resin, for example, thus completing the desired device.

The reason why the gate insulating film can be prevented from being broken down by the circuit and structure of the present embodiment will be understood from the following description directed to those investigations of the breakdown phenomenon of the output MISFET, which have been conducted by the inventors.

Figure 2:
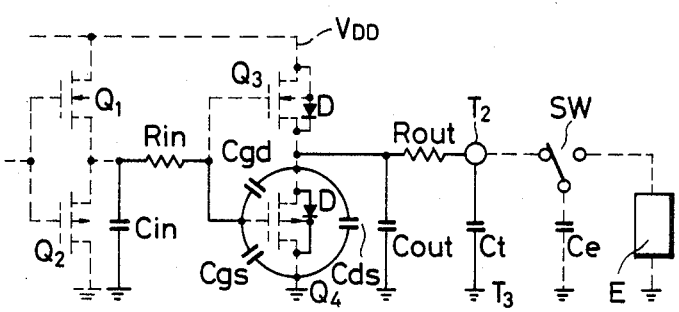
FIG. 2 is an equivalent circuit diagram of the same.

The dielectric breakdown can take place at both the P- and N-channel output MISFETs. In order to facilitate the understanding, nevertheless, the following description will be made upon only one of the output MISFETs. FIG. 2 mainly shows such an equivalent circuit to the P-channel output MISFET for the purpose of explaining the dielectric breakdown. Incidentally, circuit portions for which the explanations are omitted in the following are indicated in dotted lines in FIG. 2.

In FIG. 2, a capacitor $C_t$ is comprised of such a parasitic capacitance as exists between the external terminal T of the bonding pad 66 or the like and the terminal $T_3$ at the ground potential. A capacitor $C_{out}$ is comprised of a wiring capacity which is inserted into such an output line as connects the commonly connected drains of the MISFETs $Q_3$ and $Q_4$ and the resistor $R_{out}$. A capacitor $C_{ds}$ is comprised of a parasitic capacitance which is connected between the drain and source of the MISFET $Q_4$ and which is made up mainly of the PN junction capacitance between the drains of the MISFETs $Q_3$ and $Q_4$ and the semiconductor substrate. A capacitor $C_{gd}$ is comprised of a parasitic capacitance between the gate and drain of the MISFET $Q_4$, in other words, the overlap capacitance between the gate and drain of the same. A capacitor $C_{gs}$ is comprised of a parasitic capacitance, i.e., an overlap capacitance between the gate and source of the MISFET $Q_4$. Moreover, a capacitor $C_{in}$ is comprised of the output capacitance of the drive circuit DA and is made up the junction capacitance between the drains of the MISFETs $Q_1$ and $Q_2$ and the substrate. Incidentally, a diode D is a diode which is made up by the PN junction formed between the drain and the substrate.

In the equivalent circuit thus far described, the capacitors $C_{out}$ and $C_{ds}$ are connected in parallel with each other. Moreover, the serially connected capacitors $C_{gd}$ and $C_{gs}$ are connected in parallel with the capacitors $C_{out}$ and $C_{ds}$ which in turn are connected in parallel.

The resistor $R_{out}$ substantially constructs an integrating circuit together with the capacitors $C_{out}$ and $C_{ds}$.

Both the capacitor $C_{gd}$ between the drain and gate and the capacitor $C_{gs}$ between the gate and source of the output MISFET $Q_4$ substantially construct a capacitance voltage-dividing circuit which is made operative to receive as an input voltage the voltage applied to the drain of the output MISFET $Q_4$.

Although not specially limited, thereto the output MISFET $Q_4$ is constructed to have a gate breakdown withstand voltage of about 80 V as a result of the fact that its gate insulating film has a thickness of about 700 to 800 Å, for example.

The capacities of the capacitors $C_{gd}$ and $C_{gs}$ acting as the overlap MIS capacity of the output MISFET which is prepared by the self-alignment technique are made remarkably low. Those capacitance are about 0.01 pF for the MISFET having a channel length of 6 μm and a channel width of about 50 μm, for example.

In the IC thus constructed, the capacitance of the capacitor $C_{ds}$ substantially has a value of about 1 to 2 pF, for example, and the capacitance of the capacitors $C_{out}$ and $C_t$ substantially have a value of about 0.2 pF.

The capacitor $C_{in}$ has a remarkably higher capacitance e.g., 0.5 to 1 pF than that of the capacitors $C_{gd}$ and $C_{gs}$ of the output MISFET notwithstanding that the MISFETs constructing the drive circuit DA are usually made to have a remarkably smaller size than the output MISFET, because it is mainly made up of the PN junction capacitance.

The voltage source for generating the abnormally high voltage such as the frictional electricity can be simulated by a condenser $C_e$ which is to be charged through a switch SW by a d.c. power source E. Although not specially limitative, the capacitance of the condenser $C_e$ has a value of several tens of hundreds pF, e.g., 200 pF, and the output voltage of the d.c. power source E has a value of several hundred volts, e.g., −250 V.

At an initial state before the abnormally high voltage is applied to the external terminal $T_2$, the gate, drain and source of the MISFET $Q_4$ are at an equal potential, for example.

When the abnormally high voltage is applied to the external terminal $T_2$ so that the drain of the output MISFET $Q_4$ takes a high voltage, a voltage appears between the drain and gate of the output MISFET $Q_4$ as a result of the capacitance voltage-division.

In case the resistor $R_{in}$ is removed from the embodiment thus far described, the capacitors $C_{in}$ and $C_{gs}$ are substantially connected in parallel with each other. Since the capacitor $C_{in}$ has the high voltage, as has been described in the above, the composed value of the capacitors $C_{in}$ and $C_{gs}$ becomes far higher than that of the capacitor $C_{gd}$. As a result, in case the resistor $R_{in}$ is removed, a voltage substantially equal to the drain voltage is applied between the gate and drain of the MISFET $Q_4$. The result is that the MISFET $Q_4$ has its gate insulating film broken down by the abnormal voltage applied to the drain thereof.

As shown in this embodiment circuit, on the contrary, in case the resistor $R_{in}$ is provided, the capacitors $C_{gs}$ and $C_{in}$ can be substantially isolated, while the abnormally high voltage is being applied, so that the capacitance voltage dividing ratio can be increased.

As a result, when the MISFET $Q_4$ has its drain fed with an abnormal voltage $V_D$, its gate voltage can be raised irrespective of the existence of the capacitor $C_{in}$ to such a value as is determined by the capacitance ratio of the capacitors $C_{gd}$ and $C_{gs}$ and by the voltage $V_D$. The capacitors $C_{gd}$ and $C_{gs}$ take substantially equal capacitances to each other. As a result, the voltage to be applied between the gate and drain of the MISFET $Q_4$ can be lowered to substantially half the value of the voltage $V_D$. Consequently, the breakdown withstand voltage of the MISFET $Q_4$ can be improved to a value twice as high as that in a case where the resistor $R_{in}$ is not provided. In other words, the gate insulating film is not broken down until the drain voltage $V_d$ exceeds a value twice as high as the withstand voltage between the gate and the drain.

Incidentally, although not specially limitative, the time constant determined by the resistor $R_{in}$ and the capacitor $C_{in}$ is set at a relatively high value, as compared with the rising time constant of the drain voltage of the MISFET $Q_4$, which is determined by the resistor $R_{out}$, the capacitors $C_{ds}$ and $C_{out}$, and so on.

Figure 3:
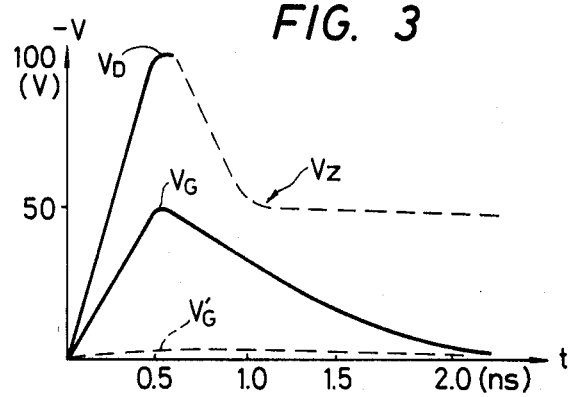
FIG. 3 is a voltage waveform chart explaining a dielectric breakdown phenomenon.

FIG. 3 illustrates one example of the transient response characteristics of the drain voltage $V_D$ and a gate voltage $V_G$ when the abnormal voltage is applied to the terminal $T_2$. As is apparent from FIG. 3, the drain voltage $V_D$ is raised with the time constant, which is determined by the resistor $R_{out}$, the capacitors $C_{ds}$ and $C_{out}$, and so on, whereas the gate voltage $V_G$ is raised with a half gradient.

The drain voltage $V_D$ is lowered, as indicated in a broken curve in FIG. 3, by the breakdown of the diode D which is constructed of the PN junction between the drain and substrate of the MISFET $Q_4$. Incidentally, the diode D includes a series resistor (although not shown) which is substantially constructed of the substrate. As a result, even if the diode D has a breakdown voltage $V_Z$ as high as about 50 V, the drain voltage $V_D$ is raised to exceed that breakdown voltage $V_Z$.

Incidentally, in case the resistor $R_{in}$ is not provided, the MISFET $Q_4$ has its gate voltage $V_G$ maintained substantially at 0 V so that it is kept non-conductive. As a result, the drain voltage $V_D$ is lowered only by the breakdown of the diode D. On the contrary, in case the resistor $R_{in}$ is provided, as in the embodiment circuit being described, the MISFET $Q_4$ is rendered conductive when its gate voltage $V_G$ is raised to substantially one half of the drain voltage $V_D$. As a result, the discharging rate of the drain voltage $V_C$ can be accelerated.

Thus, if the rise of the drain voltage $V_D$ can be depressed, the breakdown withstand voltage can be further improved.

Figure 4:
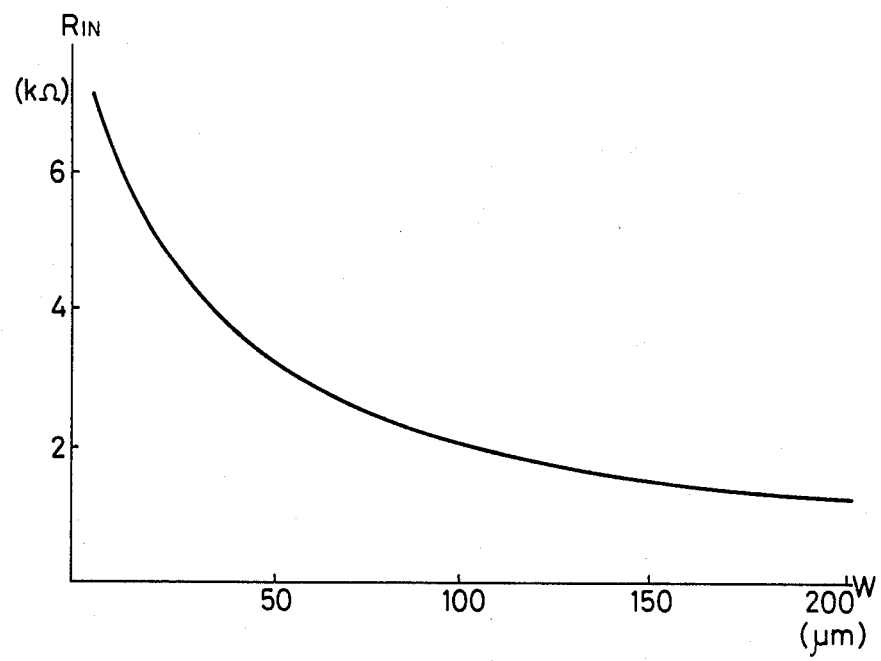
FIG. 4 is a characteristic graph illustrating the correlation between the resistance of a resistor $R_{in}$ to be set and the channel width W of a MISFET.

FIG. 4 illustrates a characteristic curve which plots the relationship between the resistor $R_{in}$ determined by that simulation and the size of the MISFET.

In FIG. 4: the abscissa indicates the channel width W (μm) of the output MISFET; and the ordinate indicates the resistance (kΩ) of the resistor $R_{in}$. The characteristic curve plots the resistance for attaining the dielectric breakdown strength of 250 V.

Incidentally, the output MISFET is made to have a gate breakdown strength of 80 V. The output MISFET also has a predetermined channel length of 6 μm. The capacitances of the capacitors $C_{gd}$ and $C_{gs}$ used in the output MISFET are proportional to the channel width W. For example, the capacitors $C_{gd}$ and $C_{gs}$ have a capacitance of about 0.013 pF for the channel width of 50 μm.

As will be understood from FIG. 4, with the increase in the channel width W, the capacitances of the capacitors $C_{gd}$ and $C_{gs}$ are accordingly increased to have their values increased relative to that of the capacitor $C_{in}$ so that the resistance of the resistor $R_{in}$ can be low.

In this simulation, incidentally, the resistance of the resistor $R_{out}$ is set at 200Ω. The other capacitors are made to have such capacitances as have been described in the above. On the other hand, the foregoing description is similarly applied to the N-channel MISFET $Q_3$ which will be dielectrically broken down by a positive voltage.

Since the output MISFETs have their gates provided with the resistors so that they may be prevented from being dielectrically broken down, the embodiment circuit thus far described does not have its output current capacitance sacrificed so that its integration is not deteriorated.

Incidentally, since the resistor $R_{in}$ is made to have a resistance of about 2 to 6 KΩ, it is desired to be constructed of a conductive polysilicone layer, as has been described. Since the resistor $R_{in}$ properly raises the gate voltage $V_G$ against the abnormal voltage, as is apparent from the foregoing description, it is desired to have a parasitic capacitance as little as possible with the semiconductor substrate. Therefore, that resistor $R_{in}$ is desired to be formed on the field oxide film, as is shown in FIG. 9.

On the other hand, the resistor $R_{out}$ is not necessarily indispensable but is relatively effective as auxiliary protecting means for preventing the gate insulating film from being broken down. The resistor $R_{out}$ substantially constructs the integrating circuit of its own resistance together with the parasitic capacitance, which is formed between itself and the semiconductor substrate, thereby to relatively satisfactorily eliminate the steep peak of the abnormal high voltage which is to be applied to the drains of the output MISFETs. Incidentally, the resistor $R_{in}$ can be dispensed with by sufficiently enhancing the protecting effect by the resistor $R_{out}$. In this instance, there arise the following problems. Specifically, in this instance, the resistor $R_{out}$ is required to have a relatively high resistance such as several hundreds ohms to several kiloohms. The resistor $R_{out}$ having such high resistance would excessively restrict the output current of the output buffer circuit. If the sizes of the output MISFETs constructing the output buffer circuit are remarkably enlarged, the resistance of the resistor $R_{out}$ can be accordingly lowered so that a desired output current can be obtained. In this case, however, the size of the output buffer circuit is abnormally enlarged.

The problems thus far described can be eliminated for the construction in which the resistor $R_{in}$ is used so as to protect the gate insulating film.

As has been described in the above, the resistor $R_{out}$ is required on one hand to have a relatively low resistance and on the other hand to have such a relatively high parasitic capacitance as can ensure sufficient integrating operations.

Therefore, the resistor $R_{out}$ is desired to be constructed of the semiconductor resistor layer having the PN junction between itself and the semiconductor substrate, as shown in FIG. 8.

Figure 5:
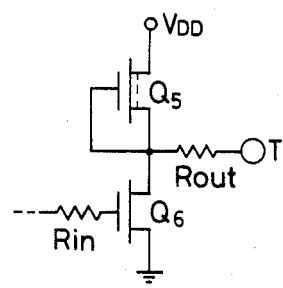
FIGS. 5 and 6 are circuit diagrams showing other embodiments of the present invention, respectively.

The present invention should not be limited to the embodiment thus far described but can employ as the circuit type of the output buffer circuit an inverter circuit which includes load means constructed of a depletion type MISFET $Q_5$ and an output MISFET such as an enhancement type MISFET $Q_6$, as shown in FIG. 5. Incidentally, the load means may be modified such that the depletion type MISFET is replaced by an enhancement type MISFET or such that the it is omitted from the monolithic IC thereby to construct the open drain output circuit.

Figure 6:
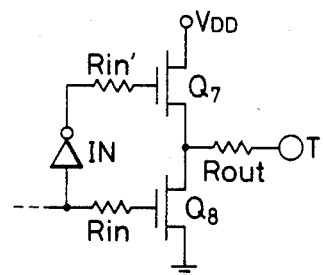

As shown in FIG. 6, moreover, in the inverted push-pull output circuit equipped with an inverter circuit IN, the source of an output MISFET $Q_7$ and the drain of an output MISFET $Q_8$ are connected with each other and with the external terminal T. In this embodiment, the MISFET $Q_7$ and $Q_8$ have their gates connected with resistors $R_{in}'$ and $R_{in}$, respectively.

Still moreover, the output buffer circuit should not be limited to the inverter but may be constructed of either all the gate circuit such as NOR or NAND or open drain type MOSFETs.

What is claimed is:

1. A semiconductor integrated circuit device comprising:
   a semiconductor substrate;
   an external terminal formed on said semiconductor substrate from which external terminal an output signal from said integrated circuit device can be derived from outside said semiconductor substrate;
   an output circuit for receiving a drive signal and for delivering said output signal to said external terminal, said output circuit including an insulated gate field effect transistor formed in said semiconductor substrate and having a first output electrode, a second output electrode coupled to said external terminal, and a gate electrode;
   a drive circuit for generating at an output terminal thereof said drive signal to be fed to said gate electrode of said insulated gate field effect transistor, said drive circuit being formed in said semiconductor substrate;
   first resistor means having one end coupled to said output terminal of said drive circuit, said first resistor means being formed on an insulating film on said semiconductor substrate such that PN junctions are not formed at said first resistor means; and
   connecting means for connecting another end of said first resistor means with said gate electrode of said insulated gate field effect transistor, said connecting means being formed on an insulating film on said semiconductor substrate such that PN junctions are not formed at said connecting means.

2. A semiconductor integrated circuit device according to claim 1, further comprising
   second resistor means connected between said second output electrode and said external terminal.

3. A semiconductor integrated circuit device according to claim 2, wherein
   the resistance of said second resistor means is made smaller than that of said first resistor means.

4. A semiconductor integrated circuit device according to claim 3, wherein
   said second resistor means is constructed of a semiconductor resistor region forming a PN junction with respect to said semiconductor substrate.

5. A semiconductor integrated circuit device according to claim 3, wherein
   said first resistor means is formed in a U-shaped form.

6. A semiconductor integrated circuit device according to claim 3, wherein
   said insulated gate field effect transistor includes source and drain regions formed in said semiconductor substrate, and said gate electrode formed between said source and drain regions, said gate electrode being constructed of a first conduction type polycrystalline silicon layer formed on an insulating film on said semiconductor substrate, said source and drain regions self-aligned with said gate electrode, and wherein said resistor layer is constructed of a first conduction type polycrystalline silicon layer.

7. A semiconductor integrated circuit device comprising:
- a semiconductor substrate;
- an external terminal formed on said semiconductor substrate from which external terminal an output signal from said integrated circuit can be derived from outside said semiconductor substrate;
- an output circuit for receiving a drive signal and for delivering said output signal to said external terminal, said output circuit including P-channel and N-channel type insulated gate field effect transistors having their respective drain electrodes coupled to said external terminal;
- a drive circuit for generating at an output terminal thereof said drive signal to be fed to the gate electrodes of said insulated gate field effect transistors, said drive circuit being formed in said semiconductor substrate;
- a first resistor element made of a polycrystalline silicon layer having one end coupled to the output terminal of said drive circuit, said first resistor element being formed on an insulating film on said semiconductor substrate such that PN junctions are not formed at said first resistor element; and
- connecting means for connecting another end of said first resistor means with said gate electrodes of said insulated gate field effect transistors, said connecting means being formed on an insulating film on said semiconductor substrate such that PN junctions are not formed at said connecting means.

8. A semiconductor integrated circuit device according to claim 7, further comprising
- a second resistor element connected between the drain electrodes of said insulated gate field effect transistors and said external terminal.

9. A semiconductor integrated circuit device comprising:
- a semiconductor substrate;
- a plurality of external terminals formed on said semiconductor substrate from which external circuits output signals from said integrated circuit device can be derived from outside said semiconductor substrate;
- a plurality of output circuits for respectively receiving drive signals and for delivering said output signals to said external circuits, said output circuits respectively including field effect transistors having first output electrodes, second output electrodes coupled to said external terminals respectively, and gate electrodes; and
- a drive circuit for feeding out at output terminals thereof said drive signals to be fed to the gate electrodes of said insulated gate field effect transistors, said drive circuit being formed in said semiconductor substrate;
- a plurality of resistor elements each having one end coupled to the output terminals of said drive circuit, said resistor elements being formed on an insulating film on said semiconductor substrate such that PN junctions are not formed at said resistor elements; and
- connecting means for connecting another end of each of said first resistor means with said gate electrodes of said insulated gate field effect transistors, said connecting means being formed on an insulating film on said semiconductor substrate such that PN junctions are not formed at said connecting means.

10. A semiconductor integrated circuit device according to claim 1, wherein said frist resistor means has a resistance between 2 K$\Omega$ and 6 K$\Omega$.

11. A semiconductor integrated circuit device according to claim 4, wherein said first resistor means has a resistance between 2 K$\Omega$ and 6 K$\Omega$.

12. A semiconductor integrated circuit device according to claim 11, wherein said second resistor means has a resistance of approximately 200$\Omega$.

* * * * *